United States Patent
Li et al.

(10) Patent No.: US 7,433,195 B2
(45) Date of Patent: Oct. 7, 2008

(54) DOUBLED-SIDED PLUGGABLE BACKPLANE

(75) Inventors: Zhenya Li, Guangdong (CN);
Konggang Wei, Guangdong (CN);
Wenjian Li, Guangdong (CN);
Chenglong Wang, Guangdong (CN);
Guzheng Wu, Guangdong (CN); Zhiguo Yang, Guangdong (CN); Junwen Jin, Guangdong (CN)

(73) Assignee: Huawei Technologies Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 10/554,545

(22) PCT Filed: Jan. 5, 2004

(86) PCT No.: PCT/CN2004/000016

§ 371 (c)(1),
(2), (4) Date: Aug. 4, 2006

(87) PCT Pub. No.: WO2004/097990

PCT Pub. Date: Nov. 11, 2004

(65) Prior Publication Data

US 2007/0178718 A1    Aug. 2, 2007

(30) Foreign Application Priority Data

Apr. 28, 2003    (CN) .......................... 03 2 51384 U

(51) Int. Cl.
*H05K 1/14* (2006.01)
(52) U.S. Cl. ........................ 361/736; 439/65; 439/78
(58) Field of Classification Search ................. 361/736, 361/788; 439/65, 74, 78, 55
See application file for complete search history.

(56) References Cited

U.S. PATENT DOCUMENTS

| | | | | |
|---|---|---|---|---|
| 2,658,182 A * | 11/1953 | Jackson et al. | ............... | 439/152 |
| 4,674,812 A * | 6/1987 | Thom et al. | ................... | 439/78 |
| 5,282,112 A * | 1/1994 | Bremer | ........................ | 361/729 |
| 5,479,618 A * | 12/1995 | Van de Steeg et al. | ......... | 700/23 |
| 5,488,541 A * | 1/1996 | Mistry et al. | ................. | 361/788 |
| 5,823,795 A * | 10/1998 | Schumacher | ............... | 439/76.1 |
| 5,844,783 A | 12/1998 | Kojima | | |
| 5,926,378 A * | 7/1999 | DeWitt et al. | ................ | 361/788 |
| 5,931,686 A * | 8/1999 | Sasaki et al. | ................... | 439/78 |
| 6,347,963 B1 * | 2/2002 | Falkenberg et al. | ......... | 439/638 |

(Continued)

FOREIGN PATENT DOCUMENTS

CN    1187910 A    7/1998

(Continued)

*Primary Examiner*—Michael C. Zarroli
(74) *Attorney, Agent, or Firm*—Baker & Hostetler LLP

(57) ABSTRACT

The invention discloses a double-sided pluggable backplane, having one side on which one or more than one front backplane connector is disposed according to width of plot positions and the other side on which one or more than one rear backplane connector is disposed according to width of plot positions, the front backplane connector and the adjacent rear backplane connector being located at the same horizontal level on the double-sided pluggable backplane and staggered right-and-left in turn, meanwhile the front backplane connector and the rear backplane connector having uniform specifications and the same contact pin definitions. The double-sided pluggable backplane according to the present invention can realize interchangeability of front boards and rear boards and have no special requirements for design and manufacture of printed circuit boards and machining of the backplane.

3 Claims, 3 Drawing Sheets

U.S. PATENT DOCUMENTS

| | | | |
|---|---|---|---|
| 6,662,255 B1 * | 12/2003 | Klein | 710/301 |
| 6,795,885 B1 * | 9/2004 | deBlanc et al. | 710/305 |
| 6,912,349 B2 * | 6/2005 | Clark et al. | 385/134 |
| 6,912,595 B2 * | 6/2005 | Deikman et al. | 709/250 |
| 2003/0012004 A1 | 1/2003 | Uehara | |
| 2004/0221084 A1 * | 11/2004 | Yates et al. | 710/305 |

FOREIGN PATENT DOCUMENTS

| | | |
|---|---|---|
| FR | 2715794 A1 | 8/1995 |
| JP | A-58-53894 | 3/1983 |
| JP | U-62-181599 | 6/1989 |
| JP | A-3-269967 | 12/1991 |
| JP | A-7-15156 | 1/1995 |
| JP | 08-037351 | 2/1996 |
| JP | A-9-312451 | 12/1997 |
| JP | 10215090 A | 8/1998 |
| JP | A-2000-31668 | 1/2000 |
| WO | WO 9521474 | 10/1995 |
| WO | WO 9634431 | 10/1996 |

* cited by examiner

DOUBLED-SIDED PLUGGABLE BACKPLANE

PRIORITY

This application claims priority to Patent Cooperation Treaty (PCT) Application No. PCT/CN2004/000016 filed on Jan. 5, 2004 entitled, A DOUBLE-SIDED PLUGGABLE BACKPLANE, which claims priority to Chinese Patent Application Serial No. 03251384.4, filed Apr. 28, 2003 all of the disclosures of which are incorporated herein by reference in their entirety.

FIELD OF THE TECHNOLOGY

The invention relates to a backplane used in a communication device, in particular to a double-sided pluggable backplane.

BACKGROUND OF THE INVENTION

At present, with high requirements for integration of a communication system, it has become a developing trend to directly multiply the number of slots with a double-sided pluggable backplane in backplane technology. Multiplication of the number of slots improves balancing of configuration granularity of system services on a board, directly leading to flexibility and reliability of design as well as feasibility for multi-production integration.

FIG. 1 schematically illustrates connection of a double-sided pluggable backplane and boards according to the prior art. As shown in FIG. 1, a front board 100 is plugged into a front backplane connector 111 of a double-sided pluggable backplane 110 by means of a plug 101, and a rear board 120 is plugged into a rear backplane connector 112 of the double-sided pluggable backplane 110 by means of a plug 121. Front board 100 is in alignment with the corresponding rear board 120. However, front backplane connector 111 and rear backplane connector 112 are located at different horizontal levels, meanwhile plug 101 of front board 100 and plug 121 of rear board 120 are located at different horizontal levels too, i.e. they are staggered up-and-down. Although front backplane connector 111 and rear backplane connector 112 can have uniform definitions for interface contact pins, yet they have different horizontal locations, thus front board 100 and rear board 120 can not be interchangeable on a double-sided pluggable backplane.

It could be seen this kind of double-sided pluggable backplane has an insurmountable disadvantage. More specifically, a board in a front slot cannot be interchanged with that in a rear slot, which is similar to back-to-back integration of two frames in essence.

Aiming at the above disadvantage, a design idea has been proposed that adopts special backplane connectors to make boards interchangeable at fore-and-aft slot positions.

FIG. 2 is a schematic diagram illustrating an interchangeable double-sided pluggable backplane and boards according to the prior art. As shown, a front board 200 is plugged into a front backplane connector 211 of a double-sided pluggable backplane 210 by means of a plug 201, and a back board 220 is plugged into a rear backplane connector 212 of double-sided pluggable backplane 210 by means of a plug 221. Both of front backplane connector 211 and rear backplane connector 212 comprise a power supply interface and a signal interface, and they are located at the same horizontal level. Meanwhile, front backplane connector 211 and rear backplane connector 212 have uniform definitions for interface contact pins, so front board 200 and rear board 220 are interchangeable on the backplane.

Here, front backplane connector 211 and rear backplane connector 212 on double-sided pluggable backplane are the same special backplane connectors, and they are aligned in the up-and-down position and fore-and-aft position absolutely. The depth of the contact pins of front backplane connector 211 and rear backplane connector 212 must be less than or approximately equal to half of the thickness of the backplane, and the contact pins must be insulated from each other.

The above-mentioned double-sided pluggable backplane has rather high requirements for its circuit board. The thickness error of the circuit board must be exceedingly tiny, otherwise it cannot be guaranteed that the depth of the contact pins of the special backplane connectors is less than or approximately equal to half of the thickness of the backplane and that the contact pins are insulated from each other. The speciality of the backplane connector, along with the special requirements for designing, manufacturing of the printed circuit board in the backplane and machining of the backplane directly bring about some insurmountable difficulties, such as costliness, difficulty in processing and so on. Therefore this kind of double-sided pluggable backplane is still in the stage of designing rather than being applied in practical manufacturing.

SUMMARY OF THE INVENTION

In view of this, an object of the invention is to provide a double-sided pluggable backplane which can realize interchangeability of front boards and rear boards, reduce design and manufacture difficulty of the double-sided pluggable backplane and lowers design cost of the board.

To achieve the above object, the technical scheme of the present invention is implemented as follows.

A double-sided pluggable backplane has one side on which one or more than one front backplane connector is disposed and the other side on which one or more than one rear backplane connector is disposed. Each front backplane connector and the adjacent rear backplane connector share width of one slot position and are located at the same horizontal level on the double-sided pluggable backplane and staggered right-and-left in turn. Meanwhile the front backplane connector and the rear backplane connector have uniform specifications and the same contact pin definitions.

Each of the front and rear backplane connectors may comprise a power supply interface connector and a signal interface connector.

Both the power supply interface connector and the signal interface connector may be common backplane connectors.

Each of the front and rear backplane connectors may comprise guiding/error-preventing pins on upper end and lower end.

From the above technical scheme of this invention, it can be seen that the double-sided pluggable backplane according to the present invention can realize interchangeability of front boards and rear boards easily with common backplane connectors by staggering the front and rear backplane connectors left-and-right. The double-sided pluggable backplane according to the invention has no special requirements for design and manufacture of printed circuit boards and machining of the backplane, which decreases cost of production and difficulty on processing. At the same time, interchangeability of front boards and rear boards reduces design cost of boards.

DETAILED DESCRIPTION OF THE INVENTION

Now, the present invention will be described in detail hereinafter with reference to an embodiment and accompanying drawings.

It is not necessary to adopt special connectors for double-sided pluggable backplane on the double-sided pluggable backplane according to the invention. Instead, narrow backplane connectors may be adopted. In an embodiment, common ZD connectors may be employed. The width sum of two connectors may approximately equal to the width of one slot position. In this invention, it is not required that the width sum of the two connectors accurately equals to the width of one slot position, and thus this invention can be realized with various kinds of common connectors, leading to easiness and flexibility in implementations.

Figure 1:
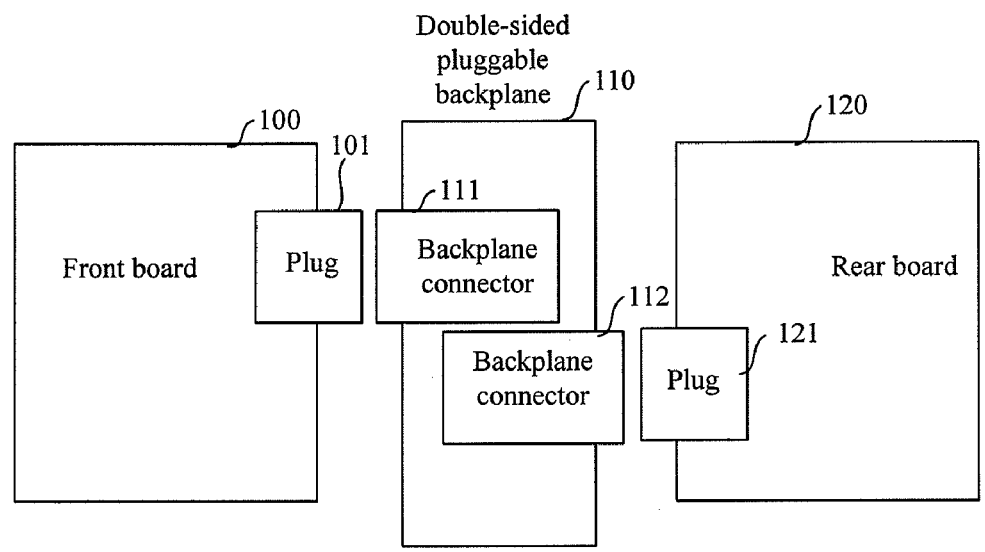
FIG. 1 is a schematic diagram illustrating connection between a double-sided pluggable backplane and boards according to the prior art.
Figure 2:
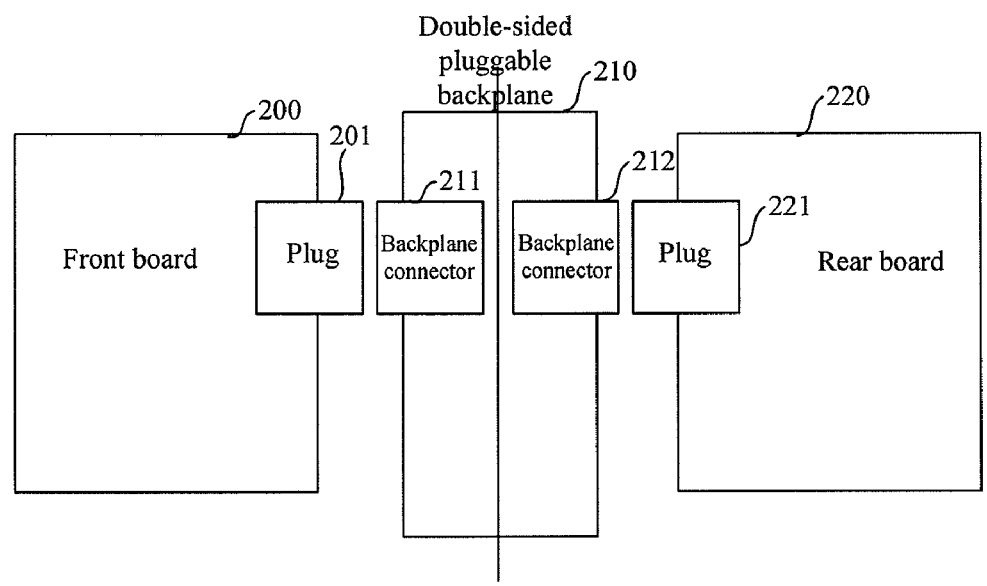
FIG. 2 is a schematic diagram illustrating an interchangeable double-sided pluggable backplane and boards according to the prior art.
Figure 3:
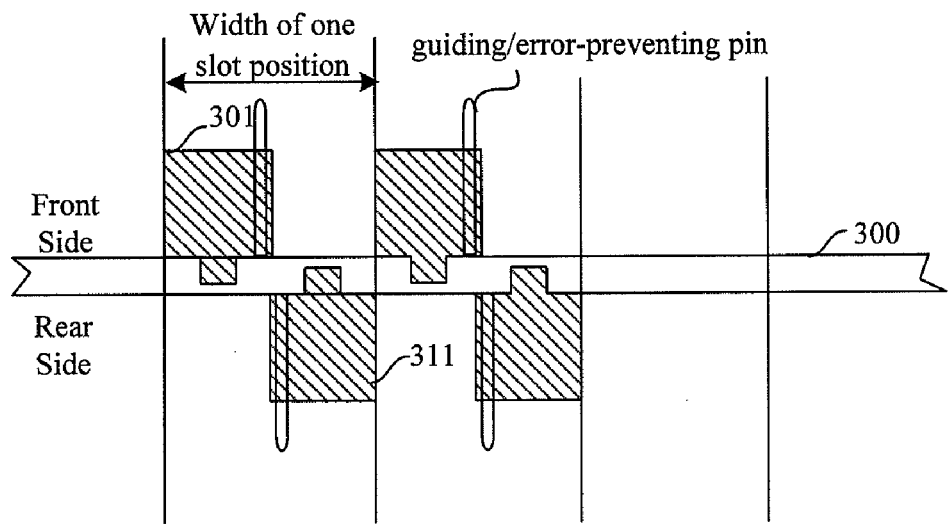
FIG. 3 is a schematic top view illustrating a double-sided pluggable backplane according to a preferred embodiment of the present invention.

FIG. 3 is a schematic top view illustrating a double-sided pluggable backplane according to a preferred embodiment of the present invention. As shown in FIG. 3, in an interval of an approximate one slot position on a double-sided pluggable backplane 300, the left half of the interval is occupied by a front backplane connector 301, and the right half of it is occupied by a rear backplane connector 311. Obviously, the right half of the interval may be occupied by front backplane connector 301, and the left half of it may be occupied by rear backplane connector 311.

If the interval of one slot position is not enough for the width sum of two backplane connectors, the front and the back slot positions may be staggered left-and-right in order to ensure the double-sided connector being installed horizontally. Generally, male connectors are adopted on the front and rear backplane connectors of the double-sided pluggable backplane, and female connectors are adopted on boards.

Figure 4:
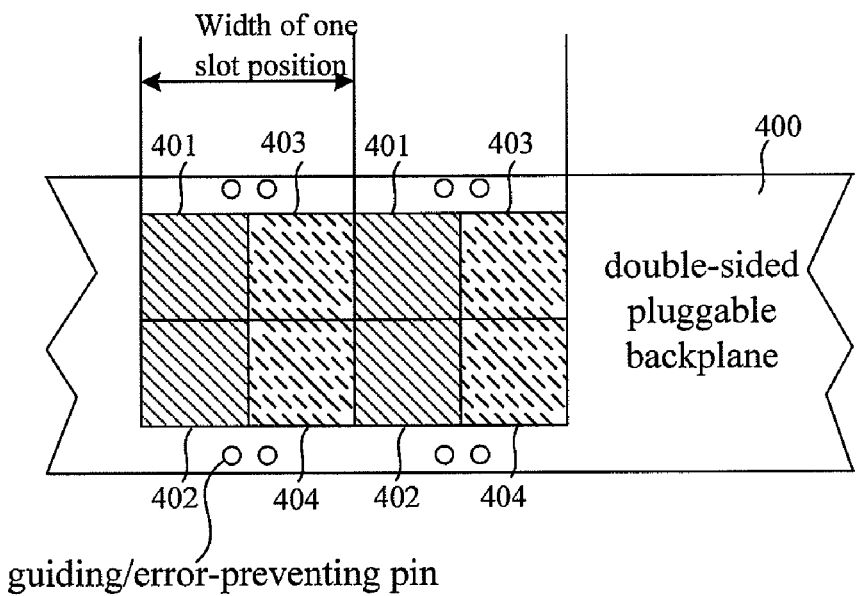
FIG. 4 is a schematic front view illustrating the double-sided pluggable backplane shown in FIG. 3.
Figure 5:
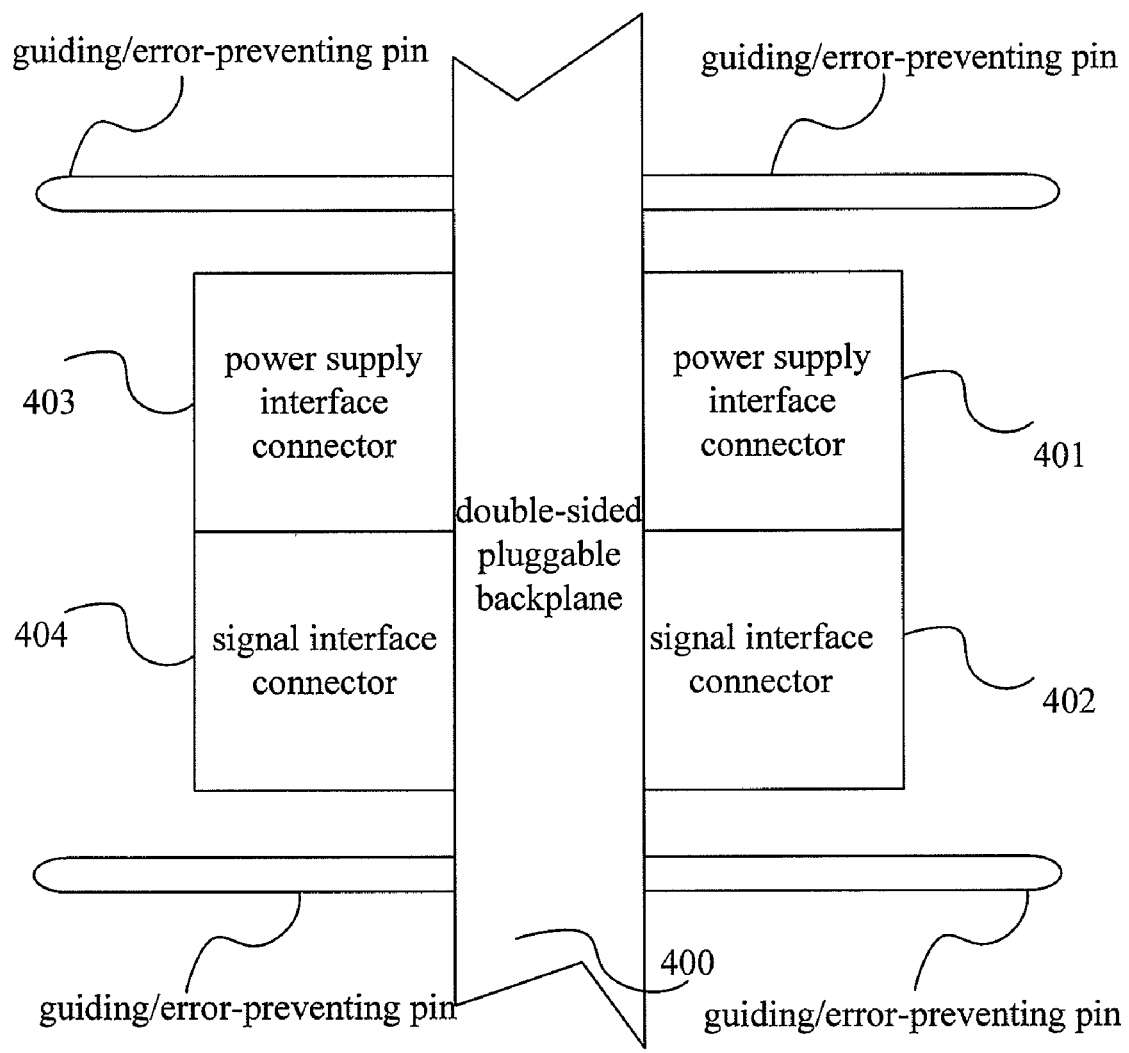
FIG. 5 is a schematic side view illustrating the double-sided pluggable backplane shown in FIG. 3.

FIG. 4 is a schematic front view illustrating the double-sided pluggable backplane shown in FIG. 3. As shown in FIG. 4, the front backplane connector and the rear backplane connector on the double-sided pluggable backplane in this embodiment respectively comprise a power supply interface connector and a signal interface connector which is a common ZD connector. The front backplane connector of double-sided pluggable backplane 400 according to the present embodiment comprises a power supply interface connector 401 and a signal interface connector 402. Power supply interface connector 401 can be located either above signal interface connector 402 or below it, providing the interface contact pin definitions of the backplane connector are the same as those of the board. In FIG. 4, reference sign 403 denotes a power supply interface connector of a rear backplane connector, while reference sign 404 denotes a signal interface connector of the rear backplane connector. Power supply interface connector 403 is identical and disposed at the same horizontal level with power supply interface connector 401 while signal interface connector 404 is identical and disposed at the same horizontal level with signal interface connector 402, and identical interface connectors have absolutely uniform contact pin definitions.

To exactly plug the boards into the front/rear backplane connectors of the double-sided pluggable backplane, guiding/error-preventing pins are set on both the upper end and lower end of each front/rear backplane connector in this embodiment. The guiding/error-preventing pins may be set at other positions of the front/back backplane connector according to practical conditions.

It can be seen the front and rear backplane connectors of the both-sided pluggable backplane according to this embodiment are disposed at the same horizontal level and have uniform contact pin definitions, which makes it not necessary to design front boards and rear boards respectively. Since the front and rear backplane connectors usually employ male connectors, the only requirement for connectors on boards is that they employ female connectors corresponding to the male connectors of the front and rear backplane connectors, thus interchangeability of the front board and the rear board is achieved and design cost for boards is lowered.

In addition, in this embodiment, the number of front backplane connectors on the both-sided pluggable backplane can be either the same as or different from the number of rear backplane connectors according to the actual requirements of communication services.

It can be seen from the above embodiment that the double-sided pluggable backplane according to the present invention can realize interchangeability between front boards and rear boards easily with common backplane connectors. The double-sided pluggable backplane according to the invention has no special requirements for design and manufacture of printed circuit boards and machining of the backplane, which decreases cost of production and difficulty on processing. At the same time, interchangeability of front boards and rear boards reduces design cost of boards.

The invention claimed is:

1. A double-sided pluggable backplane, having one side on which one or more than one front backplane connector is disposed and the other side on which one or more than one rear backplane connector is disposed, wherein each front backplane connector and the adjacent rear backplane connector share the width of one slot position, and are located at the same horizontal level on the double-sided pluggable backplane and staggered right-and-left in turn; said front backplane connector and said rear backplane connector have uniform specifications and the same contact pin definitions; each of said front and rear backplane connectors comprises a power supply interface connector and a signal interface connector.

2. The double-sided pluggable backplane of claim 1, wherein both said power supply interface connector and said signal interface connector are common backplane connectors.

3. The double-sided pluggable backplane of claim 1, wherein each of said front and rear backplane connectors comprises guiding/error-preventing pins on an upper end and a lower end.

* * * * *